(12) United States Patent
Parz et al.

(10) Patent No.: US 12,189,200 B2
(45) Date of Patent: Jan. 7, 2025

(54) TAPERED WAVEGUIDE SEMICONDUCTOR OPTICAL DEVICES WITH INCREASED FACET REFLECTIVITY

(71) Applicant: MACOM Technology Solutions Holdings, Inc., Lowell, MA (US)

(72) Inventors: Wolfgang Parz, Ithaca, NY (US); Meng Wang, Ithaca, NY (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/676,674

(22) Filed: Feb. 21, 2022

(65) Prior Publication Data

US 2023/0266548 A1 Aug. 24, 2023

(51) Int. Cl.
G02B 6/42 (2006.01)
F21V 8/00 (2006.01)
G02B 6/43 (2006.01)

(52) U.S. Cl.
CPC ......... *G02B 6/4295* (2013.01); *G02B 6/0046* (2013.01); *G02B 6/4296* (2013.01); *G02B 6/43* (2013.01)

(58) Field of Classification Search
CPC .................................................. G02B 6/4295
See application file for complete search history.

(56) References Cited

U.S. PATENT DOCUMENTS

| | | | |
|---|---|---|---|
| 5,499,261 A | | 3/1996 | Welch |
| 5,537,432 A | * | 7/1996 | Mehuys ................. G02B 6/305 372/50.11 |
| 5,914,978 A | * | 6/1999 | Welch ..................... H01S 5/026 372/20 |
| 6,014,396 A | * | 1/2000 | Osinski .................... H01S 5/10 372/50.23 |
| 2005/0238078 A1 | * | 10/2005 | Pipino ....................... H01S 3/08 372/92 |
| 2009/0232453 A1 | | 9/2009 | Muendel |
| 2012/0057440 A1 | * | 3/2012 | Challener ............ G11B 5/6088 369/13.32 |

OTHER PUBLICATIONS

International Search Report and Written Opinion as issued by the International Searching Authority, dated Apr. 21, 2023, for International Patent Application No. PCT/US2023/011042; 15 pages.

* cited by examiner

*Primary Examiner* — Chris H Chu
(74) *Attorney, Agent, or Firm* — Faegre Drinker Biddle & Reath LLP

(57) ABSTRACT

A semiconductor optical device includes a first facet bounding a first end of the semiconductor optical device. The semiconductor optical device further includes a waveguide having a first end proximate the first facet, the first end of the waveguide being tapered towards the first facet. The first facet has a curvature to increase modal reflectivity at a first interface at which the first end of the waveguide meets the first facet.

16 Claims, 4 Drawing Sheets

TAPERED WAVEGUIDE SEMICONDUCTOR OPTICAL DEVICES WITH INCREASED FACET REFLECTIVITY

FIELD

The present disclosure relates to semiconductor photonic devices and in particular to tapered semiconductor optical devices.

BACKGROUND

Tapered waveguide semiconductor optical device designs are utilized in many semiconductor optical applications, such as semiconductor lasers, super-luminescent diodes, high-finesse optical filters, optical amplifiers, and the like. For example, a waveguide and/or an active region of a semiconductor optical device may be tapered to provide beam shaping by the semiconductor optical device, reduce optical density at a facet of the semiconductor optical device, increase power output of the semiconductor optical device, etc. Semiconductor optical devices sometimes require high modal reflectivity at a facet of the semiconductor optical device, to ensure that when a light signal of a particular guided mode in the semiconductor optical device interfaces with the facet, the light signal at the particular guided mode gets at least substantially reflected back into the semiconductor optical device. However, tapering sometimes causes a reduction of reflectivity at the interface between a tapered waveguide and/or active region and a facet a semiconductor optical device.

SUMMARY

In an exemplary embodiment, a semiconductor optical device is provided. The semiconductor optical device comprises a first facet bounding a first end of the semiconductor optical device. The semiconductor optical device further comprises a waveguide having a first end proximate the first facet, the first end of the waveguide being tapered towards the first facet. The first facet has a curvature to increase modal reflectivity at a first interface at which the first end of the waveguide meets the first facet.

In an example thereof, the semiconductor optical device further comprises a high-reflection coating provided on the first facet.

In a further example thereof, the curvature of the first facet is of a cylindrical shape having a constant radius designed to at least substantially optimize the modal reflectivity at the first interface at which the first end of the waveguide meets the first facet.

In yet another example thereof, the curvature of the first facet is of a non-cylindrical shape having a non-constant radius designed to at least substantially optimize the modal reflectivity at the first interface at which the first end of the waveguide meets the first facet.

In still another example thereof, the semiconductor optical device further comprises a second facet bounding a second end of the semiconductor optical device. The second facet may be configured to emit an output beam of light from the semiconductor optical device.

In yet another example thereof, the second end of the waveguide is not tapered towards the second facet.

In a still further example thereof, the semiconductor optical device further comprises high-reflection coating provided on the second facet.

In another example thereof, the second facet is at least substantially flat.

In yet another example thereof, the second end of the waveguide is tapered towards the second facet.

In still another example thereof, the second facet has a curvature to increase modal reflectivity at the second interface at which the second end of the waveguide meets the second facet.

In another exemplary embodment, a method of fabricating a semiconductor optical device is provided. The method comprises etching a first facet to bound a first end of the semiconductor optical device. The method further comprises forming a waveguide having a first end meting the first facet at a first interface, the first end being tapered towards the first facet. The first facet has a curvature to increase modal reflectivity at the first interface at which the first end of the waveguide meets the first facet.

In a further example thereof, the method further comprises providing a high-reflection coating on the first facet.

In another example thereof, the curvature of the first facet is of a cylindrical shape having a constant radius designed to at least substantially optimize the modal reflectivity at the first interface at which the first end of the waveguide meets the first facet.

In yet another example thereof, the curvature of the first facet is of a non-cylindrical shape having a non-constant radius designed to at least substantially optimize the modal reflectivity at the first interface at which the first end of the waveguide meets the first facet.

In a further example thereof, the method further comprises etching a second facet to bound the semiconductor optical device at a second end, wherein the second facet end is configured to emit an output beam of light from the semiconductor optical device.

In yet another example thereof, the second end of the waveguide is not tapered towards the second facet.

In a still further example thereof, the method further comprises providing a high-reflection coating on the second facet.

In yet an example thereof, the second facet is at least substantially flat.

In another example thereof, the second end of the waveguide is tapered towards the second facet.

In still another example thereof, the second facet has a curvature to increase modal reflectivity at the second interface at which the second end of the waveguide meets the second facet.

BRIEF DESCRIPTION OF THE DRAWINGS

The above-mentioned and other features and advantages of this disclosure, and the manner of attaining them, will become more apparent and will be better understood by reference to the following description of exemplary embodiments taken in conjunction with the accompanying drawings, wherein.

Corresponding reference characters indicate corresponding parts throughout the several views. The exemplification set out herein illustrates an exemplary embodiment of the invention and such exemplification is not to be construed as limiting the scope of the invention in any manner.

DETAILED DESCRIPTION OF THE DRAWINGS

Figure 1:
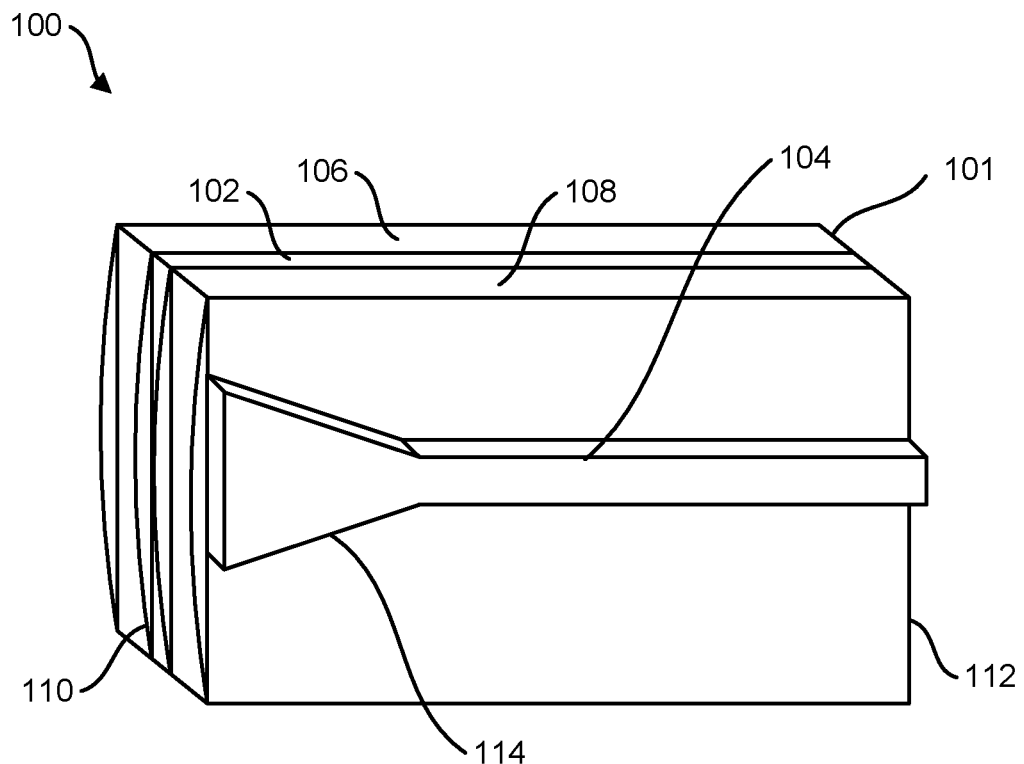
FIG. 1 is a diagram illustrating an exemplary semiconductor optical device with a tapered waveguide and a curved facet, in accordance with embodiments of the present disclosure.

For the purposes of promoting an understanding of the principles of the present disclosure, reference is now made to the embodiments illustrated in the drawings, which are described below. The embodiments disclosed herein are not intended to be exhaustive or limit the present disclosure to the precise form disclosed in the following detailed description. Rather, the embodiments are chosen and described so that others skilled in the art may utilize their teachings. Therefore, no limitation of the scope of the present disclosure is thereby intended. Corresponding reference characters indicate corresponding parts throughout the several views.

The terms "couples", "coupled", "coupler" and variations thereof are used to include both arrangements wherein the two or more components are in direct physical contact and arrangements wherein the two or more components are not in direct contact with each other (e.g., the components are "coupled" via at least a third component), but yet still cooperate or interact with each other.

In some instances throughout this disclosure and in the claims, numeric terminology, such as first, second, third, and fourth, is used in reference to various components or features. Such use is not intended to denote an ordering of the components or features. Rather, numeric terminology is used to assist the reader in identifying the component or features being referenced and should not be narrowly interpreted as providing a specific order of components or features.

FIG. 1 is a diagram illustrating an exemplary semiconductor optical device 100, in accordance with various embodiments of the present disclosure. The semiconductor optical device 100 may be a semiconductor laser, a semiconductor optical amplifier, a semiconductor optical filter (e.g., a high-finesse optical filter), a light emitting diode, a super-luminescent diode, etc., in various embodiments. In an embodiment, the semiconductor optical device 100 includes a waveguide 101 having an active layer 102 and a ridge 104. Semiconductor optical device 100 also includes an n-type cladding layer 106 and a p-type cladding layer 108. In embodiments, n-type cladding layer 106 is positioned below active layer 102 and p-type cladding layer 108 is positioned above active layer 102. Semiconductor optical device 100 also includes a first facet 110 bounding a first end of the semiconductor optical device. In an embodiment, the first facet 110 bounds a rear end of the semiconductor optical device 100, and the first facet 110 is sometimes referred to herein as "rear facet" 110. The semiconductor optical device 100 may also include a second facet 112 bounding a second end of the semiconductor optical device. In an embodiment, the second facet 112 bounds a front end of the semiconductor optical device 100, and the second facet 112 is sometimes referred to herein as "front facet" 112.

It should be appreciated that although, for exemplary purposes, the semiconductor optical device 100 is described herein as a ridge waveguide having an active region, this is not necessarily the case. For example, in some embodiments, the semiconductor optical device 100 may be a passive optical device that does not include an active region. As another example, the semiconductor optical device 100 may comprise a waveguide that does not include a ridge, in some embodiments.

With continued reference to FIG. 1, the waveguide 101 includes at least one tapered section 114. In an embodiment, the tapered section 114 may be at a first end of the waveguide 101, the first end being proximate the rear facet 110, as illustrated in FIG. 1. The tapered section 114 of the waveguide 101 may thus meet the rear facet 110 at a first interface between the waveguide 101 and the rear facet 110, in this embodiment. In another embodiment, the tapered section 114 may be at a second end of the waveguide 101, the second end being proximate the front facet 112. The tapered section 114 of the waveguide 101 may thus meet the front facet 112 at a second interface between the waveguide 101 and the front facet 112, in this embodiment. Although a single tapered section 114 is illustrated in FIG. 1, the waveguide 101 may include multiple tapered sections 114, in some embodiments. For example, in addition to the tapered section 114 positioned proximate the rear facet 110 and interfacing at a first interface with the rear facet 110, the waveguide 101 may include a second tapered section 114 positioned proximate the front facet 110 and interfacing at a second interface with the front facet 110, in some embodiments.

In an embodiment, the active layer 102 may include one or more tapered sections that may, for example, at least substantially match one or more tapered sections 114 of the waveguide 101. In another embodiment, the active layer 102 is not tapered (e.g., does not include any tapered sections).

The front facet 112 of the semiconductor optical device 100 may be configured to emit a beam of light from the semiconductor optical device 100. Front facet 112 may have a low-reflection coating provided thereon. Exemplary low-reflection coatings reflect up to about 1%, 2%, 3%, etc. of incident light. In an embodiment, the front facet 112 may be at least substantially flat. In an embodiment, the front facet 112 may be formed by etching, for example. For example, at least substantially flat shape of the front facet 112 may be formed by an etching process used to form the front facet 112. In another embodiment, the front facet 112 may be cleaved.

The rear facet 110 of the semiconductor optical device 100 may be a non-emitting facet configured to reflect light back into the semiconductor optical device 100. Rear facet 110 may be highly reflective. In an embodiment, rear facet 110 may have high-reflection or anti-reflection coating provided thereon. Exemplary high-reflection coatings reflect up to about 95% incident light. In another embodiment, the rear facet 110 of the semiconductor optical device 100 may have a medium-reflection coating provided thereon. Exemplary medium-reflection coatings reflect up to 60%, 70%, 80%, 90%, etc. In other embodiments, other suitable high-reflection or medium-reflection coatings may be utilized.

Tapering (e.g., the one or more tapered sections 114 of the waveguide 101) in the semiconductor optical device 100 may provide various benefits, such as reducing the optical density at a facet of the semiconductor optical device 100, increasing output power of the semiconductor optical device 100, etc. However, due to the tapering in the waveguide 101, reflectivity at the interface of a tapered section of the waveguide 101 with a facet (e.g., the rear facet 110) of the semiconductor optical device 100 may be reduced as compared to an equivalent architecture but without tapering in the waveguide 101. In an embodiment, the facet (e.g., rear facet 110) is curved to improve modal reflectivity at the interface at which the tapered waveguide 101 meets the rear facet 110, such that when the light signal of a particular guided mode in the semiconductor optical device 100 interfaces with the rear facet 110, the light signal at the particular guided mode gets at least substantially reflected back into the semiconductor optical device 100. For example, the rear facet 110 may be designed to have a curvature that optimizes modal reflectivity at a guided mode of light traveling in the semiconductor optical device 110 when the light signal reaches the rear facet 110 such that the light gets optimally reflected into the guided mode of light in the semiconductor optical device 100. In an example, the curvature of the rear facet 110 may be convex as illustrated in FIG. 1. In another embodiment, the curvature of the rear facet 110 may be convex. In various embodiments, curvature of the rear facet 110 may be formed by an etching process used for forming the rear facet 110. For example, curvature of the rear facet 110 may be formed in the process of etching the rear facet 110, in various embodiments.

As discussed above, in some embodiments, the front facet 112 of the semiconductor optical device 100 may be flat. In other embodiments, the front facet 112 of the semiconductor optical device 100 may comprise a curvature (e.g., a convex curvature or a concave curvature). For example, although the waveguide 101 is illustrated in FIG. 1 as having a tapered section 114 interfacing with rear facet 110, the waveguide 101 may additionally or alternatively include a tapered section 114 interfacing with the front facet 112, in some embodiments. In some such embodiments, the front facet 112 may include a curvature (e.g., a convex curvature or a concave curvature) in addition to or instead of curvature provided on the rear facet 110. In an embodiment, the curvature of the front facet 112 may be configured to increase (e.g., optimize) modal reflectivity at the interface at which a tapered section 114 of the waveguide 101 meets the front facet 112, such that when the light signal of a particular guided mode in the semiconductor optical device 100 interfaces with the front facet 110, the light signal at the particular guided mode gets at least substantially reflected back into the semiconductor optical device 100.

An example embodiment of a method of fabricating a semiconductor optical device (e.g., the semiconductor optical device 100) with one or more curved facets (e.g., the rear facet 110 and/or the front facet 112) includes etching a facet to bound an end (e.g., rear end or front end) of the semiconductor optical device, and forming a waveguide (e.g., the waveguide 101) having a first end meeting the facet, the first end being tapered towards the facet, where the facet has a curvature to increase modal reflectivity at an interface at which the first end of the waveguide meets the facet. In an example embodiment, etching of the facet having curvature is performed prior to forming of the waveguide that has a tapered end meeting the facet. In another example embodiment, forming of the waveguide having an end tapered towards a facet is performed prior to etching of the facet, where etching of the facet includes forming curvature of the facet.

Figure 2:
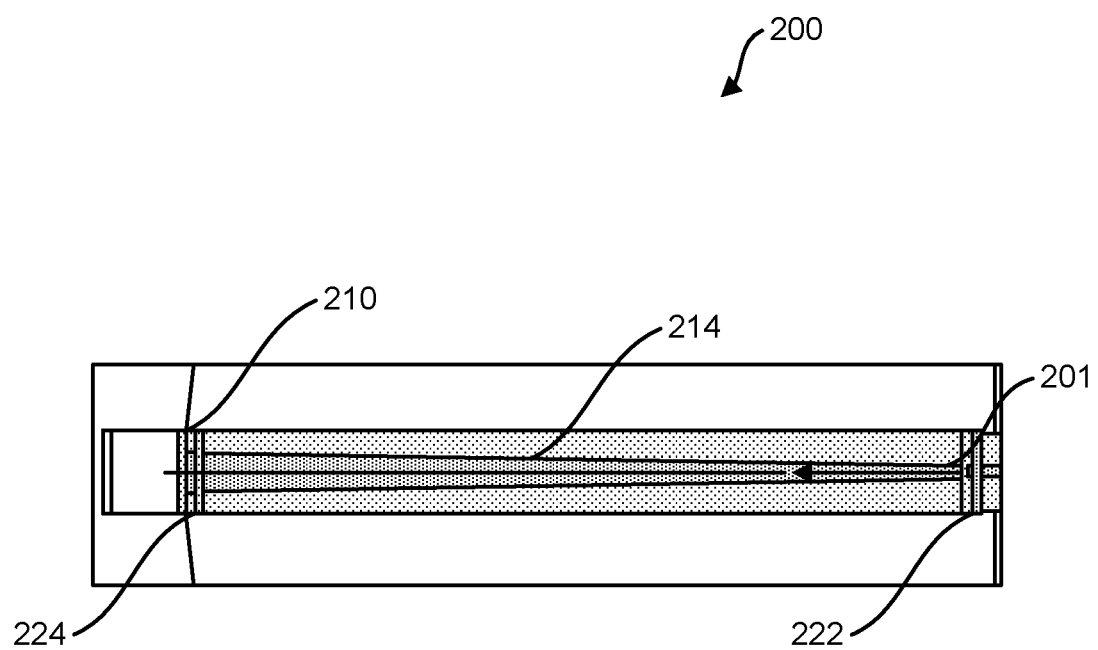
FIG. 2 is a diagram depicting a model that may be used for a simulation to determine a curvature for a facet for optimal reflectivity at an interface between the facet and a tapered waveguide, in accordance with embodiments of the present disclosure.

In various embodiments, curvature of a facet (e.g., the rear facet 110 and/or the front facet 112) may be designed to optimize modal reflectivity at the interface of the tapered waveguide 101 with the facet. FIG. 2 is a diagram depicting a model 200 that may be used for a simulation to determine a curvature for a facet for optimal reflectivity at an interface between a tapered waveguide and the facet, in accordance with an embodiment of the present disclosure. The model 200 may be utilized to model and optimize modal reflectivity at the interface of the tapered waveguide 101 with the rear facet 110 in the semiconductor optical device 100, for example. The model 200 models a portion of a waveguide 201 having a tapered section 214. The tapered section 214 may be proximate a facet 210, which may be a rear, non-emitting, facet of the semiconductor optical device 200. Curvature of the facet 210 may be determined such that modal reflectivity at an interface at which the tapered section 214 of the waveguide 201 meets the facet 210 is at least substantially optimized for the guided mode of light traveling in the semiconductor optical device 200. In embodiments, the curvature of the facet 210 may be determined based on a width w1 of the tapered section 214 at a tip end 222 of the tapered section 214, a width w2 of the tapered section 214 at the interface with the facet 210, and a length l of the tapered section 214. In an example embodiment, the width w1 of the tapered section 214 at the tip end 222 is at least approximately equal to 2 μm, the width w2 of the tapered section 214 at the interface with the facet 210 is at least approximately equal to 8 μm, and the length l of the tapered section 214 is at least approximately equal to 100 μm. In other embodiments, other suitable tapered geometries are utilized. In some embodiments, the curvature of the facet 210 may be determined further based on a reflectivity of a coating that may be provided on the facet 210.

In an embodiment, the curvature of the facet 210 may have a shape of a face of a cylinder. In this embodiment, the radius of the curvature of the facet 210 may be constant across the facet 210. In another embodiment, the curvature of the facet 210 may have a non-cylindrical shaping having a non-constant radius. For example, the radius of curvature of the facet 210 may be continually decreasing across the facet 210 from a first end (e.g., a top end) of the facet 210 to a second end (e.g., a bottom end) of the facet 210, or vise-versa. Non-cylindrical shape of the facet 210 may be designed to optimize modal reflectivity of the facet 210 at the guided mode of light traveling in the waveguide 201. For example, non-cylindrical shape of the facet 210 may be designed to further increase reflectivity of the facet 210 at the guided mode of light traveling in the waveguide 201 relative to an increase in modal reflectivity provided by an optimized cylindrical shape of the facet 210. In an embodiment, the curvature of the facet 210 may be determined using simulations, such as finite difference time domain (FDTD) simulations. In other embodiments, the curvature of the facet 210 may be determined using other suitable methods.

Figure 3:
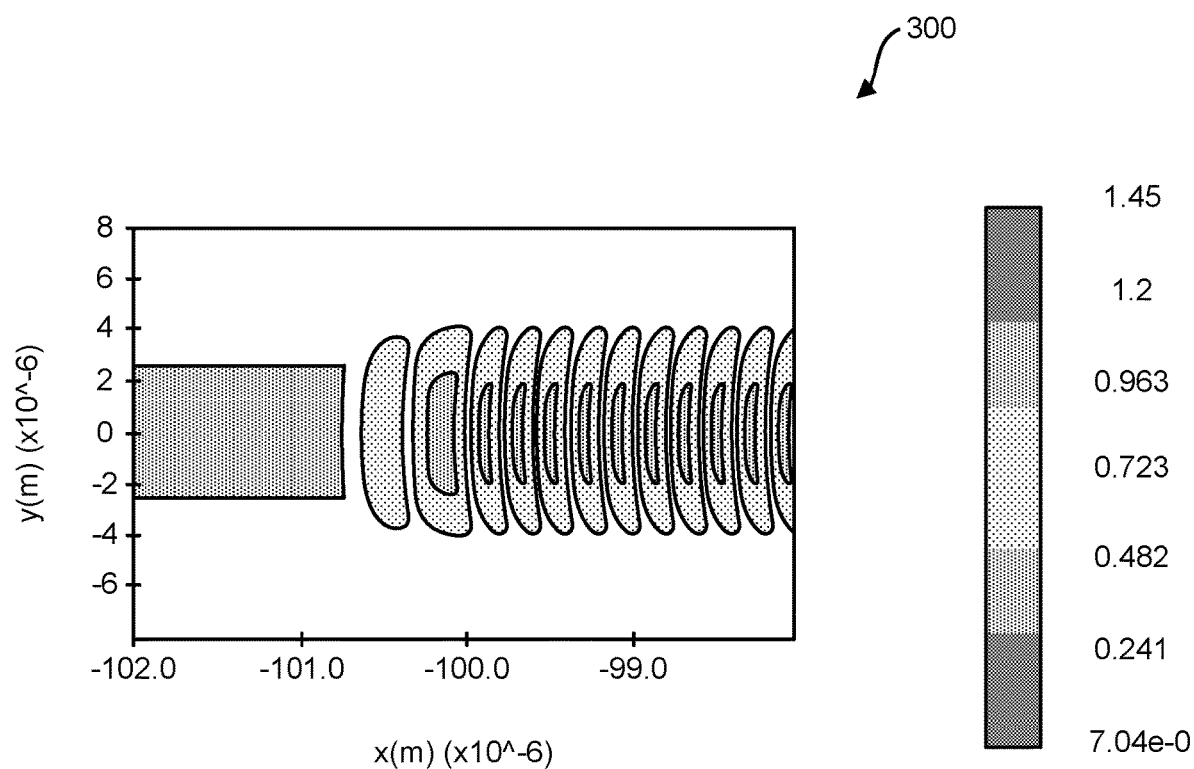
FIG. 3 is a plot depicting simulated standing wave electrical field in a tapered waveguide of a semiconductor optical device with a curved facet, in accordance with embodiments of the present disclosure.

Referring briefly to FIG. 3, a plot 300 depicts simulated standing wave electrical field in a tapered waveguide of a semiconductor optical device with a curved facet, in accordance with an embodiment of the present disclosure. As can be seen in FIG. 3, the standing wave electrical field in the semiconductor optical device comprises a curved profile corresponding to curvature of the curved facet of the semiconductor optical device.

Figure 4:
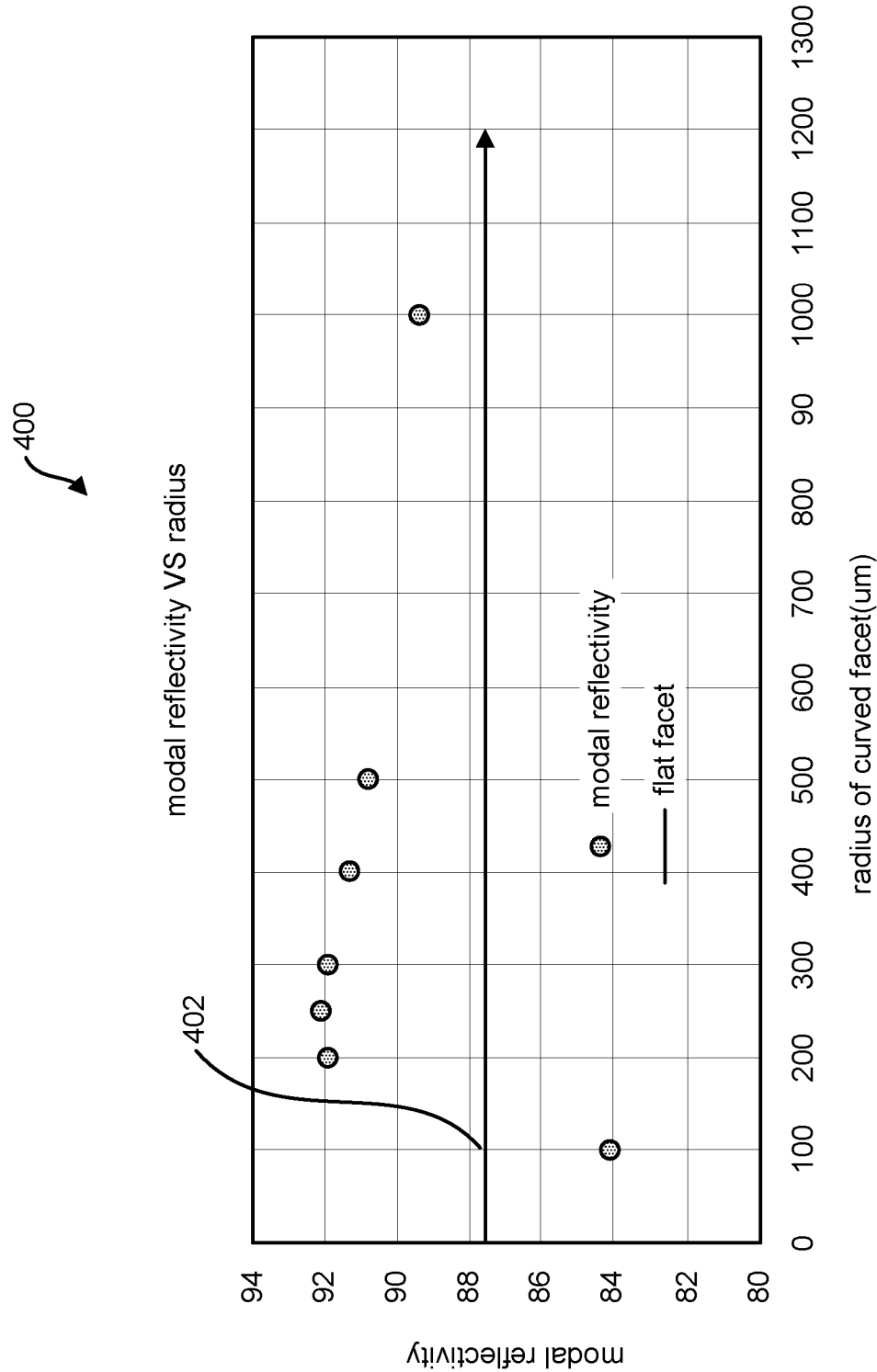
FIG. 4 is a plot illustrating modal reflectivity of a tapered cavity versus radius of curvature of a facet interface, in accordance with embodiments of the present disclosure.

Turning now to FIG. 4, a plot 400 illustrates modal reflectivity of light at an interface of a tapered waveguide with a facet of a semiconductor optical device versus radius of curvature of the facet of the semiconductor optical device, in accordance with an embodiment of the present disclosure. The plot 400 may illustrate results of simulations performed for a particular mode of light in the semiconductor optical device and reflectivity of a particular coating that may be provided on the facet of the semiconductor optical device.

The plot 400 shows a line 402 that may depict the modal reflectivity at the interface of the tapered waveguide with the facet of the semiconductor optical device when the facet is flat (i.e., radius of curvature of the facet is infinite). As can be seen in FIG. 4, the modal reflectively at the interface of the tapered waveguide with the facet of the semiconductor optical device when the facet is flat may be close to 88%, in the illustrated embodiment. As can also be seen in FIG. 4, at relatively small radii of curvature of the facet, the modal reflectivity at the facet may be lower than the modal reflectivity of a flat facet. For example, with a radius of 100 μm of the curvature of the facet, the modal reflectively at the interface of the tapered waveguide with the facet may be close to 84%, in the illustrated embodiment. As the radius of the curvature of the facet is increased, the modal reflectively at the interface of the tapered waveguide with the facet may increase relative the modal reflectively at the interface of the tapered waveguide with the facet of the semiconductor optical device when the facet is flat. As the radius of the curvature of the facet is increased further, however, the modal reflectively at the interface of the tapered waveguide with the facet may begin decreasing. Thus, a radius of curvature of the face providing a maximum modal reflectivity may be determined based on the point in the plot 400 at which the modal reflectively at the interface of the tapered waveguide with the facet begins decreasing, for example. In an embodiment, the maximum modal reflectivity achieved with such curved facet is higher than modal reflectivity at the interface of the tapered waveguide with the facet of the semiconductor optical device when the facet is flat. For example, in the embodiment of FIG. 4, whereas the modal reflectively at the interface of the tapered waveguide with the facet of the semiconductor optical device when the facet is flat (i.e., with an infinite radius of curvature) may be close to 88%, with a radius of 250 μm of the curvature of the facet, the modal reflectively at the interface of the tapered waveguide with the facet may be close to 92%. In the example embodiment of FIG. 4, the radius at least approximately equal to 250 μm of the curvature of the facet provides the optimized modal reflectivity at the interface of the tapered waveguide with the facet of the semiconductor optical device. Accordingly, the semiconductor optical device may be designed and fabricated with the facet having curvature with the radius of curvature of the facet being at least approximately equal to 250 μm to optimize the modal reflectivity at the interface of the tapered waveguide with the facet. In some embodiments, simulations may be performed with non-cylindrical curvatures of the facet to the modal reflectivity at the interface of the tapered waveguide with the facet. For example, simulations may be performed to vary the radius of the curvature across the facet to determine a shape of the curvature of the facet that may optimize modal reflectivity at the interface of the tapered waveguide with the facet.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

We claim:

1. A semiconductor optical device, comprising:
a first facet bounding a first end of the semiconductor optical device; and
a waveguide having a first end proximate the first facet, the first end of the waveguide being tapered towards the first facet, wherein the first facet has a curvature to increase modal reflectivity at a first interface at which the first end of the waveguide meets the first facet;
wherein the curvature of the first facet is one of a cylindrical shape having a constant radius or a non-cylindrical shape having a non-constant radius.

2. The semiconductor optical device of claim 1, further comprising a high-reflection coating provided on the first facet.

3. The semiconductor optical device of claim 1, further comprising a second facet bounding a second end of the semiconductor optical device, wherein a second end of the waveguide is proximate the second facet, and wherein the second facet is configured to emit an output beam of light from the semiconductor optical device.

4. The semiconductor optical device of claim 3, wherein the second end of the waveguide is not tapered towards the second facet.

5. The semiconductor optical device of claim 4, further comprising a high-reflection coating provided on the second facet.

6. The semiconductor optical device of claim 4, wherein the second facet is at least substantially flat.

7. The semiconductor optical device of claim 3, wherein the second end of the waveguide is tapered towards the second facet.

8. The semiconductor optical device of claim 7, wherein the second facet has a curvature to increase modal reflectivity at a second interface at which the second end of the waveguide meets the second facet.

9. A method of fabricating a semiconductor optical device, comprising:
etching a first facet to bound the semiconductor optical device at a first end; and
forming a waveguide having a first end proximate the first facet at a first interface, the first end being tapered towards the first facet, wherein the first facet has a curvature to increase modal reflectivity at a first interface at which the first end of the waveguide meets the first facet;
wherein the curvature of the first facet is one of a cylindrical shape having a constant radius or a non-cylindrical shape having a non-constant radius.

10. The method of claim 9, further comprising providing a high-reflection coating on the first facet.

11. The method of claim 9, further comprising etching a second facet to bound the semiconductor optical device at a second end, wherein the second facet is configured to emit an output beam of light from the semiconductor optical device.

12. The method of claim 11, wherein the second end of the waveguide is not tapered towards the second facet.

13. The method of claim 12, further comprising providing a high-reflection coating on the second facet.

14. The method of claim 12, wherein the second facet is at least substantially flat.

15. The method of claim 11, wherein the second end of the waveguide is tapered towards the second facet.

16. The method of claim 15, wherein the second facet has a curvature to increase modal reflectivity at the second interface at which the second end of the waveguide meets the second facet.

* * * * *